(12) United States Patent
Holland et al.

(10) Patent No.: US 10,573,637 B2
(45) Date of Patent: Feb. 25, 2020

(54) CARRIER BYPASS FOR ELECTROSTATIC DISCHARGE

(71) Applicant: Nexperia B.V., Nijmegen (NL)

(72) Inventors: Steffen Holland, Hamburg (DE); Hans-Martin Ritter, Nahe (DE)

(73) Assignee: Nexperia B.V., Nijmegen (NL)

( * ) Notice: Subject to any disclaimer, the term of this patent is extended or adjusted under 35 U.S.C. 154(b) by 230 days.

(21) Appl. No.: 15/357,570

(22) Filed: Nov. 21, 2016

(65) Prior Publication Data

US 2018/0145065 A1    May 24, 2018

(51) Int. Cl.
| | |
|---|---|
| H01L 27/02 | (2006.01) |
| H01L 29/872 | (2006.01) |
| H01L 29/808 | (2006.01) |
| H01L 29/417 | (2006.01) |
| H01L 29/87 | (2006.01) |
| H01L 29/78 | (2006.01) |
| H01L 29/06 | (2006.01) |
| H01L 29/08 | (2006.01) |
| H01L 27/12 | (2006.01) |

(Continued)

(52) U.S. Cl.
CPC ...... *H01L 27/0255* (2013.01); *H01L 27/0262* (2013.01); *H01L 27/1203* (2013.01); *H01L 29/0847* (2013.01); *H01L 29/41758* (2013.01); *H01L 29/78* (2013.01); *H01L 29/808* (2013.01); *H01L 29/861* (2013.01); *H01L 29/87* (2013.01); H01L 29/0649 (2013.01); H01L 29/0692 (2013.01); H01L 29/8083 (2013.01); H01L 29/872 (2013.01); H02H 9/046 (2013.01)

(58) Field of Classification Search
CPC ............. H01L 27/0255; H01L 27/0248; H01L 27/0262; H01L 27/1203; H01L 29/0649; H01L 29/0847; H01L 29/41758; H01L 29/78; H01L 29/808; H01L 29/87; H01L 29/872; H02H 9/046
USPC .......................................................... 361/56
See application file for complete search history.

(56) References Cited

U.S. PATENT DOCUMENTS

| | | | |
|---|---|---|---|
| 6,803,633 B2 * | 10/2004 | Mergens | H01L 27/0292 |
| | | | 257/173 |
| 9,203,237 B2 | 12/2015 | Ritter et al. | |
| 9,349,716 B2 * | 5/2016 | Sorgeloos | H01L 29/87 |

(Continued)

FOREIGN PATENT DOCUMENTS

EP    2482314 B1    3/2016

OTHER PUBLICATIONS

"ESD8101: Low Capacitance SCR ESD Protection Diode in 01005 DSN" Product Overview, ON Semiconductor, Energy Efficient Innovations, Oct. 14, 2016.

*Primary Examiner* — Zeev V Kitov
(74) *Attorney, Agent, or Firm* — Ohlandt, Greeley, Ruggiero & Perle L.L.P.

(57) ABSTRACT

Various aspects of the disclosure are directed to circuitry that may be used to shunt current. As may be consistent with one or more embodiments a first circuit has a plurality of alternating p-type and n-type semiconductor regions with respective p-n junctions therebetween, arranged between an anode end and a cathode end. A second (e.g., bypass) circuit is connected to one of the alternating p-type and n-type semiconductor regions, and forms a further p-n junction therewith. The second circuit operates to provide carrier flow, which influences operation of the first circuit.

19 Claims, 13 Drawing Sheets

(51) Int. Cl.
*H02H 9/04* (2006.01)
*H01L 29/861* (2006.01)

(56) References Cited

U.S. PATENT DOCUMENTS

| | | |
|---|---|---|
| 2012/0175672 A1 | 7/2012 | Ritter |
| 2013/0248883 A1* | 9/2013 | Das .................. H01L 24/49 |
| | | 257/77 |
| 2015/0102384 A1* | 4/2015 | Zhan ................ H01L 27/0262 |
| | | 257/173 |

* cited by examiner

CARRIER BYPASS FOR ELECTROSTATIC DISCHARGE

OVERVIEW

Aspects of various embodiments are directed to the use of inductively coupled signal lines to provide protection for circuitry from electrostatic discharge (ESD) events.

ESD events can result in significant damage of circuit components and can result in eventual failure of the circuit. Certain technology advances, such as the increase in data speeds for input and output circuitry, can increase the susceptibility of the protected circuitry to harm from ESD events. In addition, increases in data signal rates can result in more stringent requirements on the operational properties of ESD protection circuitry. Further, various ESD circuits may exhibit capacitances that can be undesirable for various applications.

These and other matters have presented challenges to ESD protection circuit implementations, for a variety of applications.

SUMMARY

Various example embodiments are directed to issues such as those addressed above and/or others which may become apparent from the following disclosure, and including issues concerning ESD protection.

As may be implemented with one or more embodiments, an apparatus includes a first circuit having a plurality of alternating p-type and n-type semiconductor regions with respective p-n junctions therebetween. The first circuit is configured and arranged to shunt current between an anode end of the first circuit and a cathode end of the first circuit. The apparatus further includes a second circuit connected to one of the alternating p-type and n-type semiconductor regions, and which forms a contact therewith. The further contact has a forward-bias voltage that is lower than a first forward-bias voltage of another p-n junction formed by the one of the alternating p-type and n-type semiconductor regions with another one of the alternating p-type and n-type semiconductor regions. In some implementations, the first circuit includes a Shockley diode and the second circuit is a bypass circuit that provides an increased trigger current required to activate the Shockley diode. For instance, the bypass circuit may attract and carry away carriers with the one of the alternating p-type and n-type semiconductor regions that forms the further p-n junction, and therein increase an amount of carriers required to trigger, or turn on, the Shockley diode.

In certain example embodiments, aspects of the present disclosure are directed to an apparatus including a Shockley diode having alternating n-regions and p-regions of semiconductor material. A first one of the p regions is connected to an anode of the Shockley diode. A first one of the n regions forms a first p-n junction with the first p region, the first p-n junction having a first forward-bias voltage. A second one of the p regions forms a second p-n junction with the first n region. A second one of the n regions is connected to a cathode of the Shockley diode and forms a third p-n junction with the second p region. A bypass circuit is connected to the anode, forms a connection to the first n region, and has a second forward-bias voltage that is lower than the first forward-bias voltage.

One or more embodiments are directed to a method involving disabling, in an OFF-mode of a Shockley diode, a bypass circuit that (when enabled) bypasses a capacitance of an anode p-n junction. In response to a voltage created by current in the Shockley diode, a bypass circuit is enabled and operated to bypass the anode p-n junction and capacitance by shunting majority carrier current within the Shockley diode to an anode. In ON-mode of the Shockley diode, the Shockley diode is enabled to conduct majority carriers between a cathode and the anode. In some embodiments, the majority carrier current is shunted by passing current through a bypass connection that has a lower forward bias than a forward bias of the anode p-n junction of the Shockley diode.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
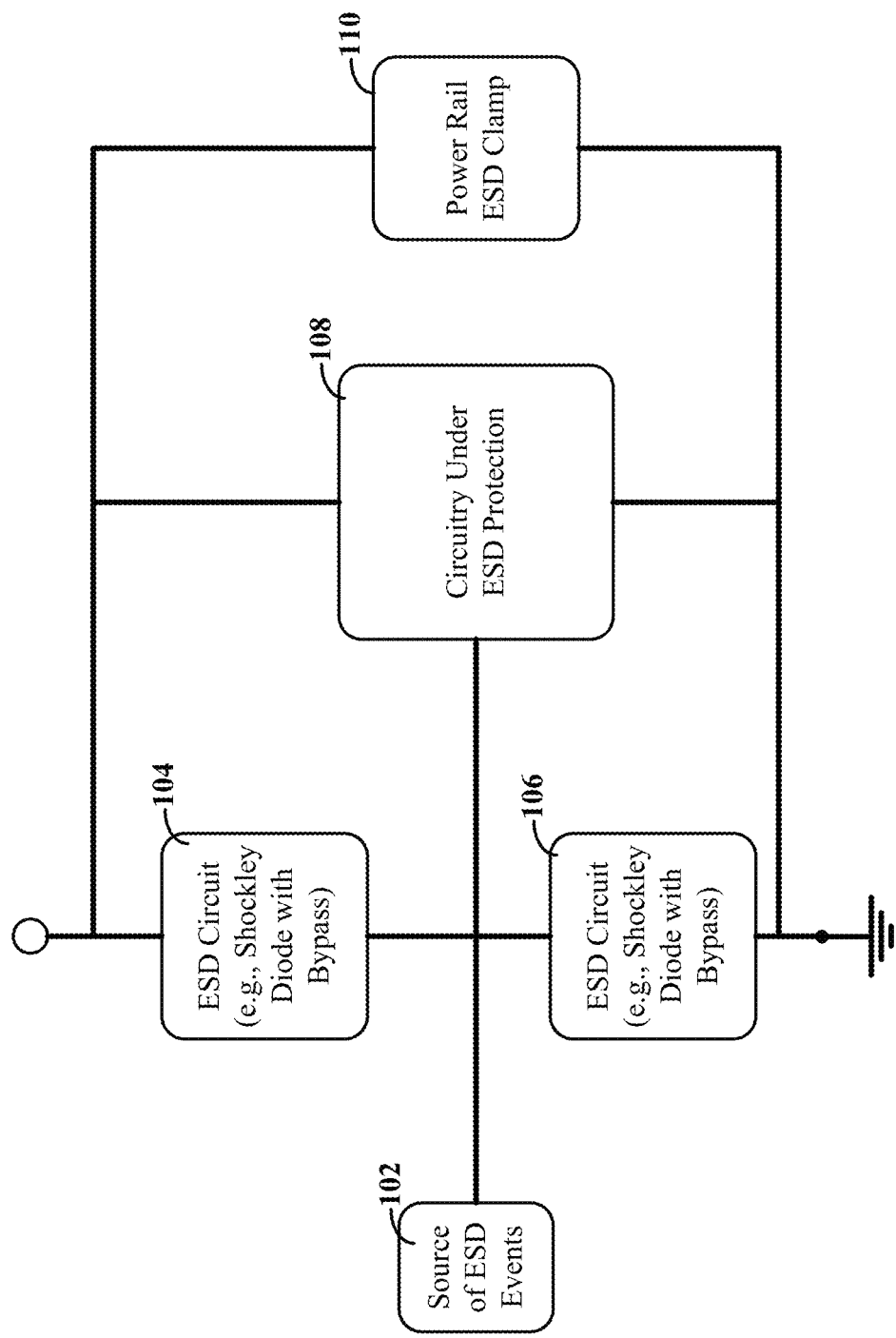
FIG. 1 is a block diagram of a system that includes ESD protection circuits, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving ESD protection circuitry. In certain implementations, aspects of the present disclosure have been shown to be beneficial when used in the context of ESD protection for integrated circuit (IC) chips where capacitive loading is an important consideration, such as for applications that use high speed differential signaling. In some embodiments, a bypass circuit is used in connection with a Shockley diode. While not necessarily so limited, various aspects may be appreciated through the following discussion of non-limiting examples and the corresponding contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed toward an ESD protection circuit that uses a Shockley diode to shunt ESD current as part of protecting circuitry from ESD events. When a reverse bias voltage is applied across a p-n junction of the Shockley diode majority carriers are generated, such as due to avalanche and/or tunneling in a central junction of the Shockley diode. The majority carriers can otherwise tend to forward bias outer p-n junctions of the Shockley diode, with these forward biased junctions injecting minority carriers that can otherwise cause the Shockley diode to turn on and thereby shunt ESD current. The ESD protection circuit includes a bypass circuit that provides a current path for the majority carriers within the Shockley diode. The current path provides a bypass of a p-n junction of the Shockley diode, countering the effect of the majority carriers upon the p-n junction and inhibiting the further injection of minority carriers, which can raise effective (trigger) current required to turn the Shockley diode on.

In particular implementations, the bypass circuit operates as a high impedance when there are no majority carrier currents, or when the majority carrier current is very low. When the majority carrier current increases, the impedance of the bypass circuit is reduced. The reduced impedance causes an increase in the amount of majority carrier current that is shunted. As discussed herein, the bypass circuit can be configured such that as majority carrier current through a central p-n junction increases further, majority carrier current also begins to flow through the outer p-n junctions of the Shockley diode in parallel with the bypass path. The Shockley diode is then turned on once the current reaches a threshold amount (trigger current). In this manner, the bypass circuit serves to increase the amount of current that is necessary to turn on the Shockley diode.

Aspects of the present disclosure are directed toward ESD protection circuits that have an effective capacitance that is low during normal operation of the circuit under protection. Capacitance associated with a Shockley diode of the ESD protection circuit can be caused primarily by capacitances associated with the p-n junctions (e.g., junction and diffusion capacitances). The capacitance can be particularly problematic for high speed signals, such as signaling used in certain radio frequency (RF) communications (e.g., ultra-wide band (UWB) operating at GHz frequencies). Particular embodiments are directed toward a Shockley diode that is designed to have a low capacitance for at least the anode junction, where the anode junction is the p-n junction closest to the anode of the diode. In certain embodiments, the cathode junction is also designed with a low capacitance, where the cathode junction is closest to the cathode of the diode. Accordingly, the Shockley diode can have a very low capacitance with three junction capacitances in series (anode junction, central junction, cathode junction), while also providing a low clamping voltage due to a deep snap back. The bypass circuit provides an alternate current path around the anode junction, such that the anode junction does not become forward-biased until a higher current (trigger current) is present, which triggers the snap-back (on-state) of the Shockley diode. The bypass circuit can operate to provide a relatively low amount of additional capacitance in parallel to the anode junction, such that both low capacitance and high trigger current can be achieved at the same time.

According to one or more embodiments, the trigger currents for the Shockley diode (both for turn on and turn off) can be increased by providing a bypass circuit that redirects carriers out of one of the internal regions of the Shockley diode. The trigger currents can also be adjusted using, for example, highly doped regions (trigger implants) at a p-n junction. It is recognized, however, that trigger implants can increase the effective capacitance of the p-n junction. Aspects of the present disclosure relate to the use of the bypass circuit to reduce the effective capacitance of the ESD protection circuit during normal operation, while providing additional control over the operational parameters of the ESD protection circuit. In particular, the bypass circuit provides a conductive path that is in parallel with one of the low capacitance junctions. When active, the parallel conductive path bypasses a low p-n capacitance of the parallel (anode) p-n junction. The parallel p-n junction is designed with a low capacitance and is connected in series with other capacitances of the diode. Thus, bypassing the p-n junction represents an increase in the capacitance of the diode. Various embodiments are directed toward the use of a bypass circuit that operates with different effective impedances corresponding to different modes of operation. For example, the bypass circuit can operate with a high impedance during normal operation and a lower impedance during an ESD event (when minority carrier current increases). In this manner, the normal operational mode of the ESD protection circuit includes the low p-n capacitance, which is bypassed in other modes of operation.

In some embodiments the bypass circuit provided a high ohmic value and facilitates a bias voltage around zero volts. In this case, the bypass circuit does not directly bypass the anode p-n junction. The low capacitance of the anode junction is then in series with the other two junction capacitances, thus reducing the total capacitance.

According to various embodiments, the bypass circuit includes a connection to the n-region that is forward biased during an ESD event. The bypass circuit is configured with a forward bias voltage that is less than the forward bias voltage of the anode p-n junction for the Shockley diode. As the current in the diode increases, the voltages across each of the bypass p-n junction and the anode p-n junction increase. Due to the lower forward bias voltage, the bypass circuit begins to conduct first and thereby diverts a portion of the current out of the diode. The result is an increase in the amount of current required before the anode p-n junction begins to conduct. In addition to a lower forward bias voltage, the bypass circuit can be located proximate to the source of the majority carriers (the reverse-biased p-n junction). This can result in a lower resistance between the bypass circuit and the source than between the anode p-n junction and the source.

In certain embodiments, aspects of the present disclosure are directed to an apparatus including a Shockley diode having alternating n regions and p regions of semiconductor material. These alternating regions form p-n junctions, including p-n junctions in a series connection that provide desirably low capacitance. A first one of the p regions is connected to an anode of the Shockley diode (e.g., with the anode being separate and/or including at least part of the first p region). A first one of the n regions forms a first p-n junction, with the first p region, exhibiting a forward-bias voltage. The first n region and a second one of the p regions form a second p-n junction, and the second p region forms a third p-n junction with a second one of the n regions. The second n region is connected to a cathode of the Shockley diode (e.g., with the cathode being separate and/or including at least part of the second n region). A bypass circuit includes a region of p-type semiconductor material connected to the anode and which forms a connection with the first n region. This bypass circuit has a forward-bias voltage that is lower than the first forward-bias voltage of the first p-n junction, which is between the first p region and the same first n region to which the bypass circuit is connected. Such an approach may, for example, be implemented to provide ESD functionality.

In various contexts, it has been recognized/discovered that the bypass circuit provides an increased trigger voltage at which the alternating n regions and p regions conduct, relative to a trigger voltage as would be associated with the Shockley diode without the bypass circuit. This approach facilitates use of the Shockley diode with respective ones of the p-n junctions providing a desirably low capacitance, while also achieving/tuning a high trigger voltage. This allows setting of the capacitance within the p-n junctions of the Shockley diode, while generally independently controlling the trigger voltage. Various aspect are also directed to tuning the trigger voltage via the construction of the bypass circuit and the nature of the respective p-n junctions.

In some embodiments, the bypass circuit is configured to set the trigger voltage by shunting, to the anode, majority carriers generated by reverse biasing the second p-n junction. The bypass circuit may set a high trigger current of the Shockley diode by providing an increased amount of current required to activate the Shockley diode via the shunting of the majority carriers. For instance, the Shockley diode may be configured to activate in response majority carriers in the first n region that are not shunted by the bypass circuit. Under such conditions, the bypass circuit shunts carriers up to a current limit that corresponds to the increase in the amount of carrier current required to activate the Shockley diode.

The bypass circuit may include one or more of a variety of semiconductor regions or other circuit attributes. In some embodiments, the bypass circuit includes a Schottky diode. The Schottky diode may, for example, have a Schottky junction with edge termination on at least one edge of the Schottky junction, with p+ contact on an edge of the Schottky junction (e.g., also providing an anode contact), with edge termination on another edge of the Schottky junction, or a combination of one or more of the edge terminations and p+ contact. In certain embodiments, the bypass circuit includes a field-effect transistor (FET), such as a junction field-effect transistor (JFET) or a metal-oxide-semiconductor field-effect-transistor (MOSFET). Such a JFET may include a gate formed by one or more p-doped trenches. Such a MOSFET may include a trench and/or a third p-region that isolates a drain thereof from the first n region.

The respective semiconductor regions may include a variety of p-type and n-type constituents. In some embodiments, the first n region includes an n− region and an n+ region, the second p region includes a p− region and a p+ region, and wherein the second p-n junction is at an intersection of the n+ region and the p+ region. In certain embodiments, the n+ doped region includes an n++ doped region and the p+ region includes a p++ doped region that forms a portion of the intersection.

Turning now to the figures, FIG. 1 is a block diagram of a system that includes ESD protection circuits, consistent with embodiments of the present disclosure. ESD protection circuits 104 and 106 provide ESD protection for circuitry 108. ESD events can be generated from any number of different types of ESD sources 102. For example, ESD events can be caused by electrical contact with the human body, direct or indirect charging of a protected device through the triboeffect or electrostatic induction, and by a machine discharging through the protected device to ground. In certain embodiments, the protected circuitry 108 can be adversely effected by capacitance on the input/output node connected to the ESD circuits 104, 106. For example, the protected circuitry 108 might receive or transmit data at high speeds. The system can also include a power rail ESD clamp circuit 110 that limits (clamps) the source to ground voltage to a safe level.

Consistent with various embodiments discussed herein, one or both of the ESD circuits 104, 106 include a Shockley diode with a bypass circuit. Certain embodiments employ only one of the ESD circuits 104 and 106, and other embodiments employ more such circuits. The bypass circuit shunts majority carriers from within the Shockley diode to the anode of the diode. The shunting of the carriers shifts the trigger current and holding current of the Shockley diode. For example, the holding current can be increased to avoid latch up conditions resulting from a holding current that is below the normal operating conditions of the protected circuitry 108.

According to certain embodiments, the bypass circuit conducts little (or no) current when the circuitry 108 is operating under normal conditions. For instance, the bypass circuit can include a connection with a forward bias voltage that is not exceeded under normal conditions. The high-impedance of the bypass circuit in this circumstance can be useful for keeping the capacitance of the ESD circuit 106, 108 low. In particular, the bypass circuit can be connected in parallel to a p-n junction of the Shockley diode, and the p-n junction of the Shockley diode can be designed with a low capacitance. When the bypass circuit has a high impedance, the capacitance of the p-n junction contributes to the effective capacitance of the ESD circuit 104, 106. More particularly, the Shockley diode includes three p-n junctions connected in series. Each of the three p-n junctions has a respective capacitance and the effective capacitance of the series connection is: $1/(1/C1+1/C2+1/C3)$. When the bypass circuit has a low impedance (e.g., during and ESD event), the corresponding capacitor is effectively removed from the circuit. While the capacitance of the ESD circuit temporarily increases in this condition, the capacitance becomes irrelevant once the ESD protection circuit activates and begins shunting current.

Figure 2:
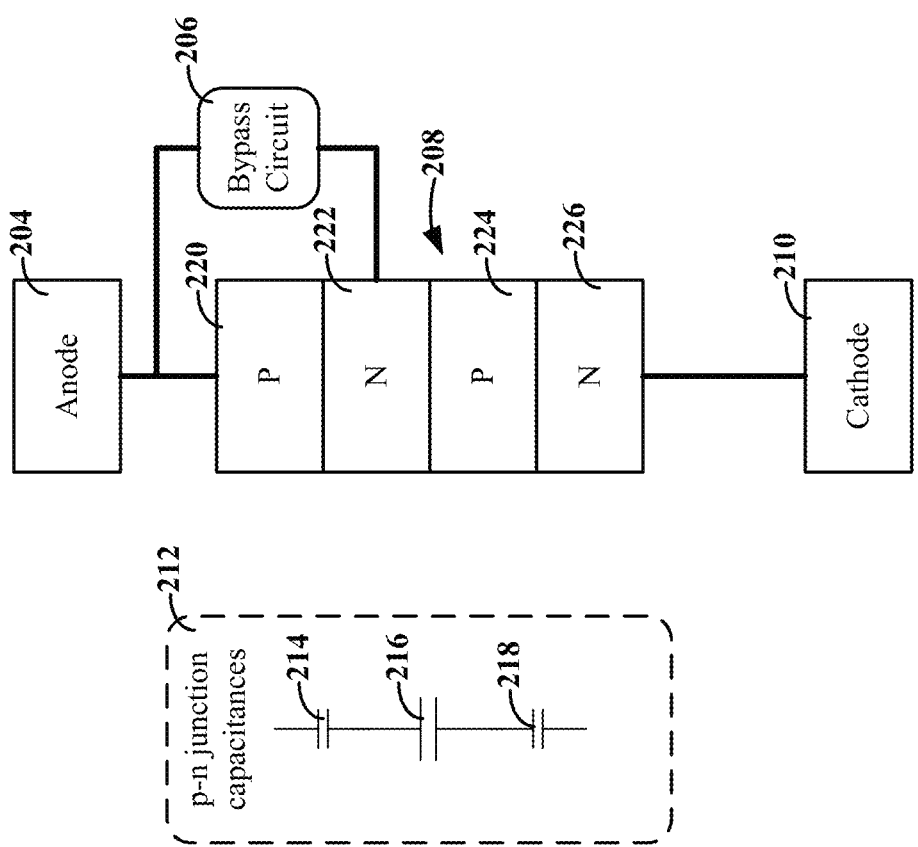
FIG. 2 is a block diagram of an ESD protection circuit with a bypass circuit, consistent with embodiments of the present disclosure.

FIG. 2 is a block diagram of an ESD protection circuit with a bypass circuit, consistent with embodiments of the present disclosure. Shockley diode 208 includes four alternating p and n regions 220, 222, 224, and 226, which collectively form three different p-n junctions. The effective capacitance 212 of the Shockley diode 208 may be represented by capacitors 214, 216, and 218, which each corresponding to the capacitance of a respective p-n junction. When voltage and current from an ESD event is applied between the cathode 210 and the anode 204, the Shockley diode 208 turns on and begins shunting ESD current from the cathode to the anode. Once the current drops below a holding current, the Shockley diode 208 turns off and stops shunting current.

Bypass circuit 206 is connected between n-region 222 and the anode 204. When conducting current (low impedance), the bypass circuit 206 provides a current path that bypasses the p-n junction formed by p-region 220 and n-region 222. In effect, the capacitance 214 is bypassed, which temporarily increases the effective capacitance as measured between the cathode 210 and anode 204. To reduce the effective capacitance, the bypass circuit 206 is configured to have a high impedance during normal operation of the circuit being protected.

The bypass circuit 206 can be implemented with a variety of circuitry. For instance, a MOSFET transistor can be implemented with its gate and a source/drain region connected to the anode 204, and a back gate and opposite source/drain region connected to the n-region 222. Certain other examples are characterized further herein, such as those shown in and described below in connection with FIG. 8.

According to particular embodiments, the Shockley diode 208 can be configured with each of capacitances 214 and 218 being relatively low and capacitance 216 being higher. This can be particularly useful for reducing the capacitance (e.g., relative to circuits with a single low capacitance). As discussed herein, the lower capacitance can be realized by using light doping (n− and p−) at the junction between the p region 220 and the n region 222 as well as at the junction between the p region 224 and the n region 226. Various aspects of the present disclosure are directed toward the recognition that the larger capacitance 216 can result, at least in part, from higher doping concentrations at the junction between n region 222 and p region 224. Higher doping concentrations (p+ and n+) can be used to prevent punch-through between the lightly doped regions 224 and 222. Thus, the corresponding p-n junction has a higher capacitance. The effect of this capacitance on the total capacitance of the Shockley diode is mitigated by the lower capacitances of the other p-n junctions, which are each connected in series.

Figure 3A:
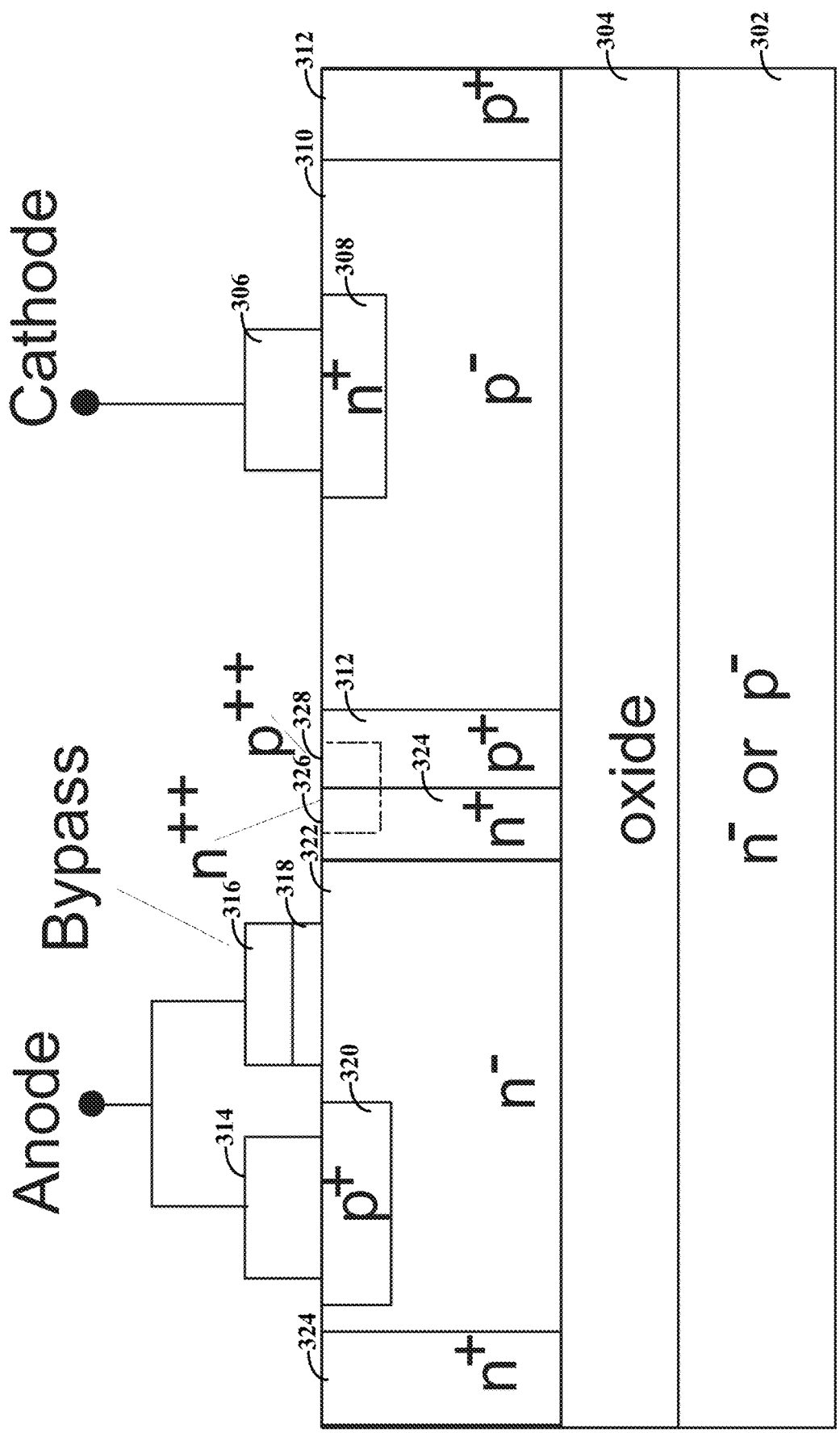
FIG. 3A is a diagram of a cross-section of an ESD protection circuit that is based upon silicon-on-insulator technology, consistent with embodiments of the present disclosure.

FIG. 3A is a diagram of a cross-section of an ESD protection circuit that is based upon silicon-on-insulator technology, consistent with embodiments of the present disclosure. Oxide 304 provides insulation between the lightly doped substrate 302 and the Shockley diode components. The Shockley diode includes a cathode contact 306 that is connected to an n+ region 308. The n+ region 308 is located within a p− region (well) 310. A heavily doped p+ region 312 surrounds the lightly doped p− region 310. Anode contact 314 is connected to a p+ region 320. The p+ region is located within n− region (well) 322, which is surrounded by a heavily doped n+ region 324.

In operation, the Shockley diode turns on in response to carriers (in this case electrons) flowing from the p-n junction formed by regions 312 and 324. A bypass circuit 318 connects to the anode through a contact 316 to provide a current path for the carriers to reach the anode. The bypass circuit 318 is configured to provide a high impedance in the absence of current. The bypass circuit 318 is also configured to begin conducting (lower impedance) majority carrier current before the anode p-n junction (between 320 and 322) begins to conduct. For example, the bypass circuit 318 can be configured with a connection that has a lower forward bias than the anode p-n junction.

According to embodiments, the anode is positively biased and the cathode is held to ground. When the anode-to-cathode voltage reaches the breakdown voltage of the diode, the majority carriers (trigger electrons) flow towards the anode. On the other side of the central junction the majority carriers (holes) flow in direction of the cathode. When the electrons flow through the p-type region 320 holes are injected into region 322, which results in the Shockley diode being turned on (triggered). The bypass circuit 318 inhibits this process by offering a lower resistance to the anode. The electrons that flow to the anode through the bypass circuit 318 do not inject holes into the lowly doped epitaxial region. Thus, this portion of the current flow does not directly contribute to the triggering of the Shockley diode.

Consider, for example, a bypass circuit 318 that includes a Schottky diode for providing the carrier bypass at low currents. The device behaves as an n-p-n bipolar transistor in series with a Schottky diode. At higher currents the voltage drop over the Schottky diode rises. Once the voltage drop exceeds the forward bias voltage of the anode p-n junction, current begins to flow through the anode p-n junction. This starts the injection of holes, which contributes to triggering of the Shockley diode.

According to certain embodiments, trigger implants 326, 328 can be used for adjusting the breakdown voltage when the device triggers. The depicted trigger implants 326, 328 are more highly doped (p++, n++) than the corresponding regions 324, 312. The corresponding junction has different breakdown characteristics that can be used to adjust the turn on characteristics of the diode.

Figure 3B:
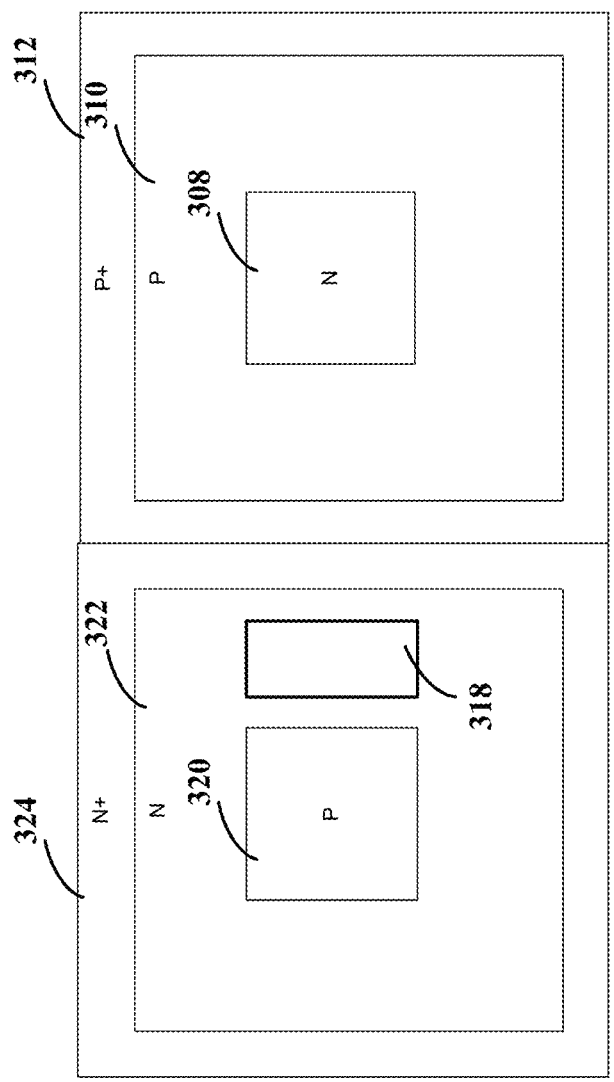
FIG. 3B is a top-down view of the ESD protection circuit from FIG. 3A, consistent with embodiments of the present disclosure.

FIG. 3B is a top-down view of the ESD protection circuit from FIG. 3A, consistent with embodiments of the present disclosure. Reference numerals used in FIG. 3B correspond to those used in FIG. 3A, with repeated discussion thereof omitted for sake of brevity. In the depicted example, the bypass circuit 318 is physically located between p region 320 and the p-n junction formed at the junction between 324 and 312. A longer distance for the current to flow can result in a higher resistance. Accordingly, the relative location can have an effect on the relative current flow in each path.

Figure 4:
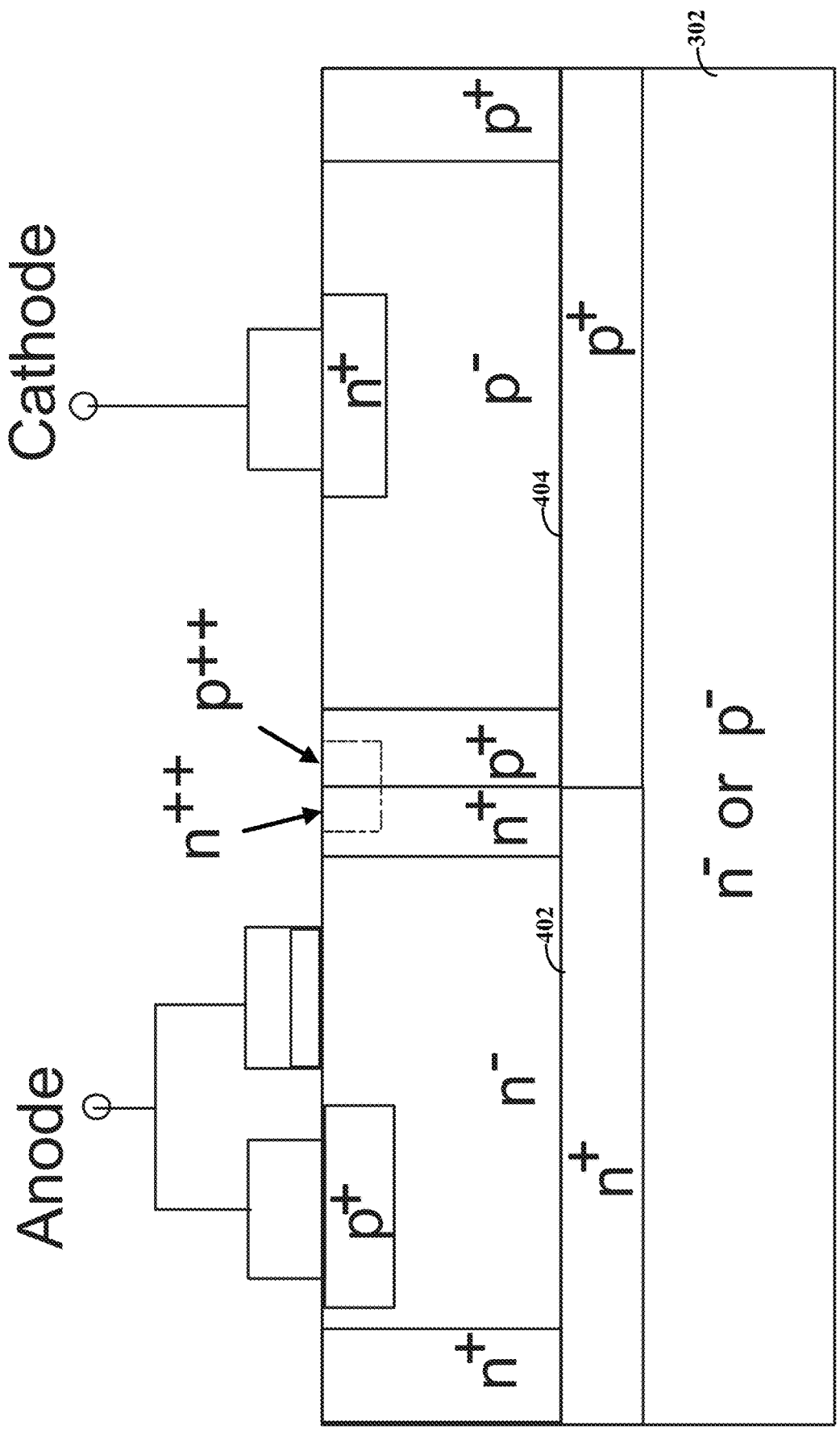
FIG. 4 is a diagram of a cross-section of an ESD protection circuit that uses buried layers for isolation from the substrate, consistent with embodiments of the present disclosure.

FIG. 4 is a diagram of a cross-section of an ESD protection circuit that uses buried layers for isolation from the substrate, consistent with embodiments of the present disclosure. Instead of a buried oxide either one or two buried layers 402, 404 can be used for isolation. The buried layers 402, 404 can be useful for avoiding adverse effects from parasitic thyristors or punch-through, which can occur when using a lightly doped substrate 302.

Figure 5:
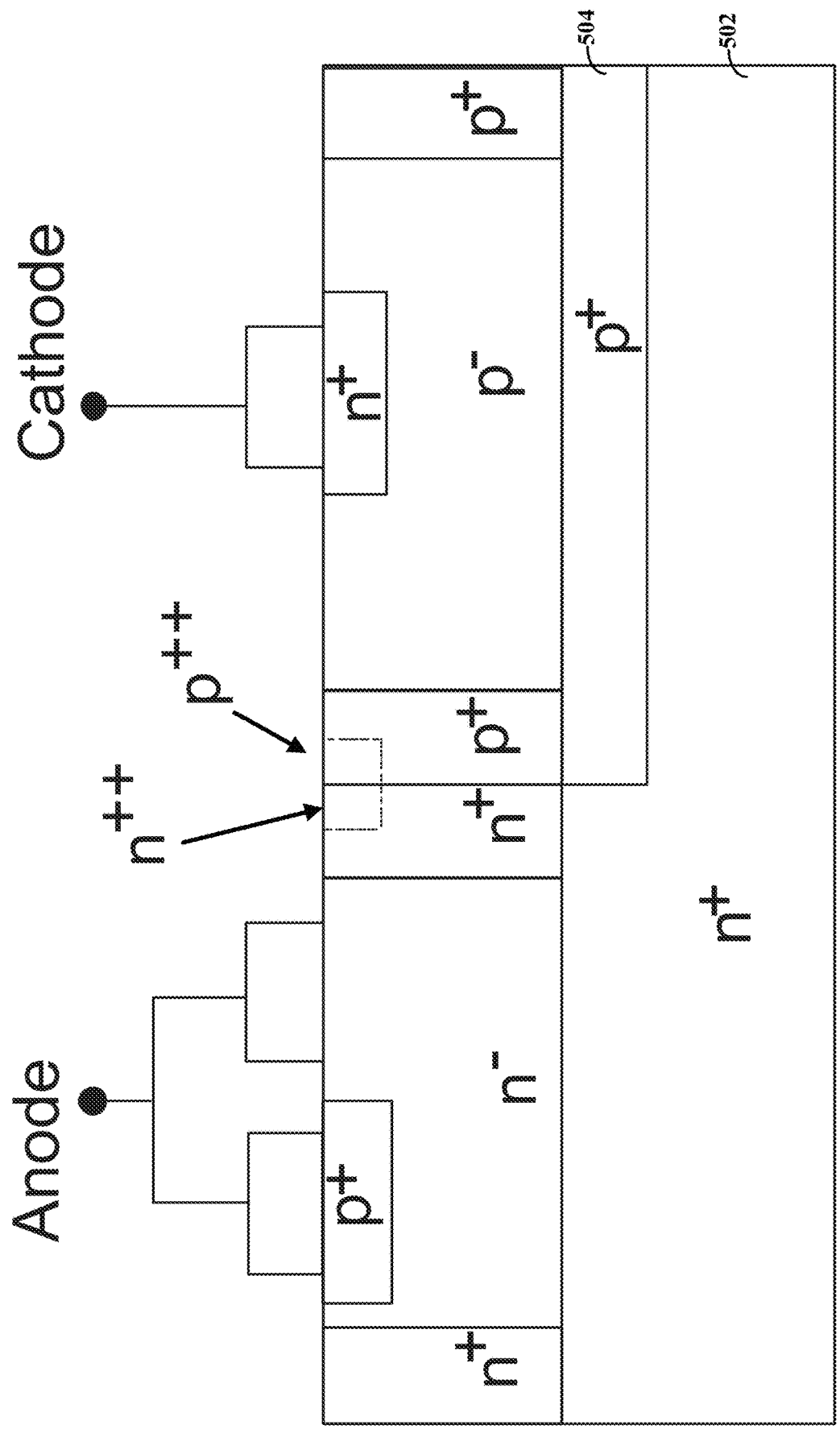
FIG. 5 is a diagram of a cross-section of an ESD protection circuit that uses a buried layer and a highly n doped substrate, consistent with embodiments of the present disclosure.

FIG. 5 is a diagram of a cross-section of an ESD protection circuit that uses a buried layer and a highly n doped substrate, consistent with embodiments of the present disclosure. When a highly doped n+ substrate 502 is used, a single buried p+ layer 504 can be used to provide isolation. The use of a highly doped substrate 502 reduces the risks associated with premature breakdown or a parasitic thyristor.

Figure 6:
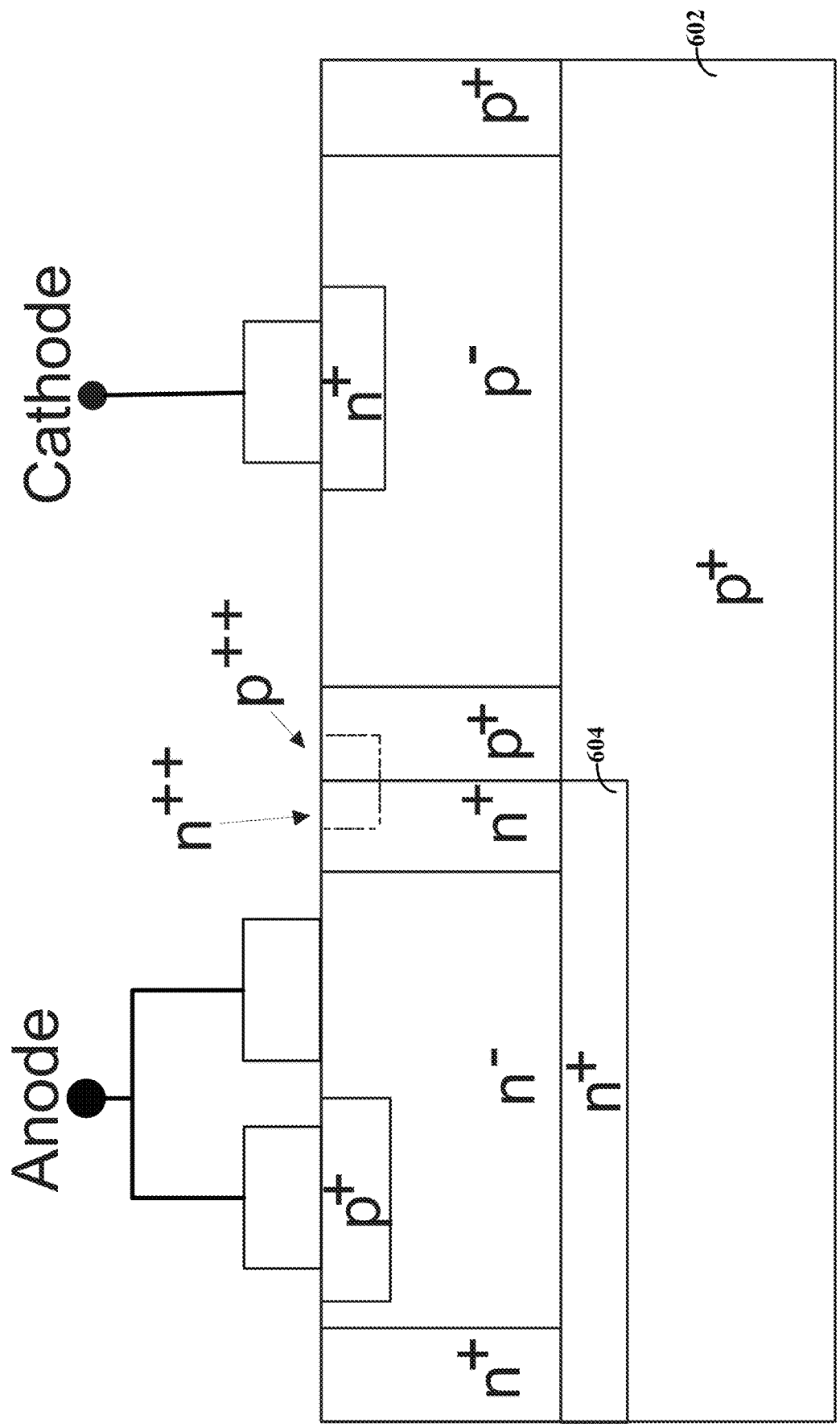
FIG. 6 is a diagram of a cross-section of an ESD protection circuit that uses a buried layer and a highly n doped substrate, consistent with embodiments of the present disclosure.

FIG. 6 is a diagram of a cross-section of an ESD protection circuit that uses a buried layer and a highly p-doped substrate, consistent with embodiments of the present disclosure. When a highly doped p+ substrate 602 is used, a single buried n+ layer 604 can be used to provide isolation. The use of a highly doped substrate 602 reduces the risks associated with premature breakdown or a parasitic thyristor.

Figure 7:
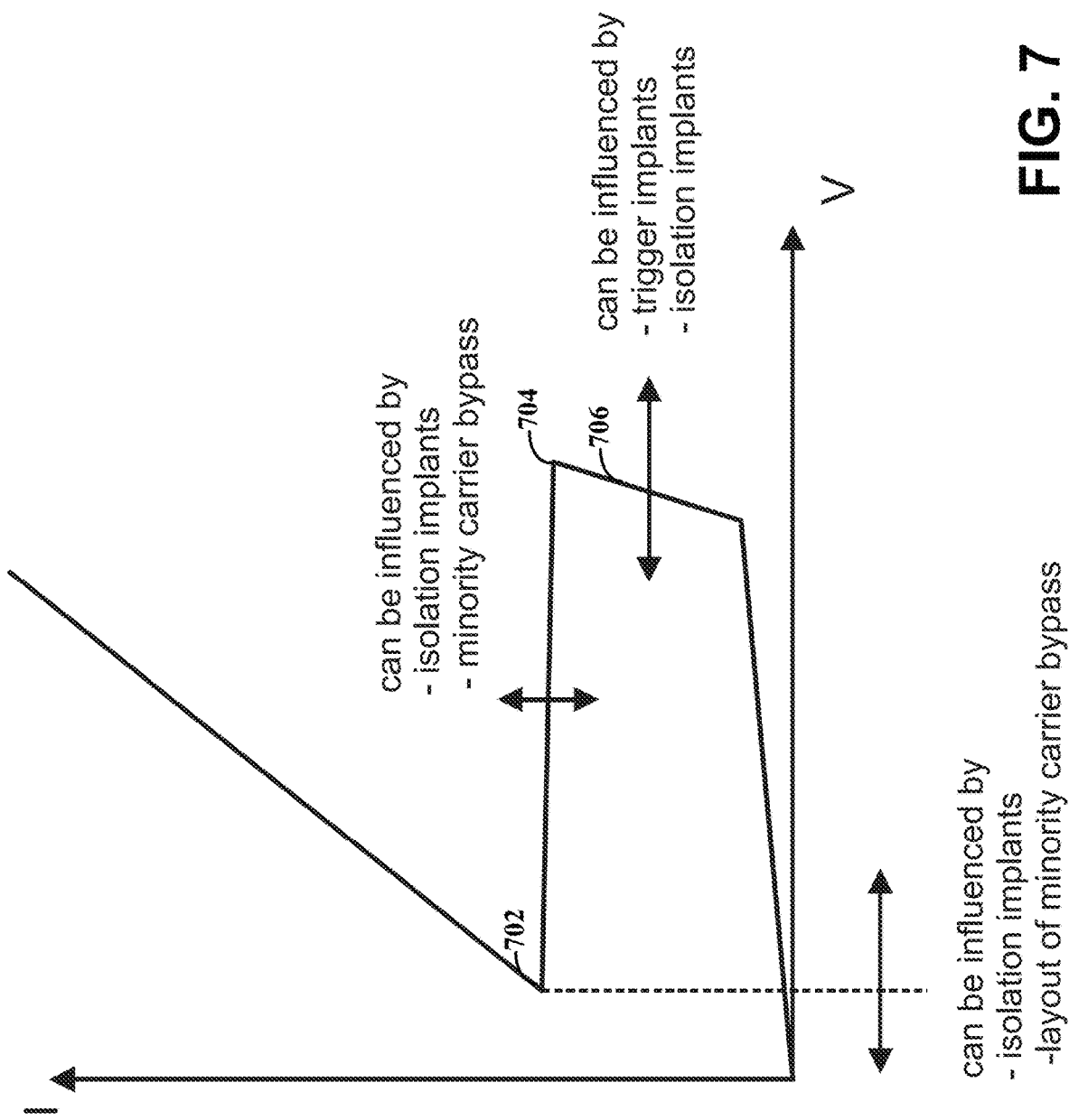
FIG. 7 is a current-voltage (IV) curve of an ESD protection circuit, consistent with embodiments of the present disclosure.

FIG. 7 is a current-voltage (IV) curve of an ESD protection circuit, consistent with embodiments of the present disclosure. The depicted IV curve shows how various characteristics can be adjusted. For instance, the holding voltage and holding current indicated at 702 can be influenced by the isolation implants and by the layout of the bypass circuit. In another instance, point 706 on the IV curve represents the beginning of breakdown where carrier current is flowing by the diode which is not yet active. The point at which this occurs can be controlled by adjusting the breakdown voltage (e.g., by the use of trigger implants and isolation implants). The diode is activated at the trigger voltage and current shown at 704. This point can be controlled by adjusting the carrier bypass circuit and by way of the isolation implants. For example, the trigger current can be tuned by layout and/or by the physical properties of the carrier bypass, for instance the work function of the Schottky metal.

Figure 8A:
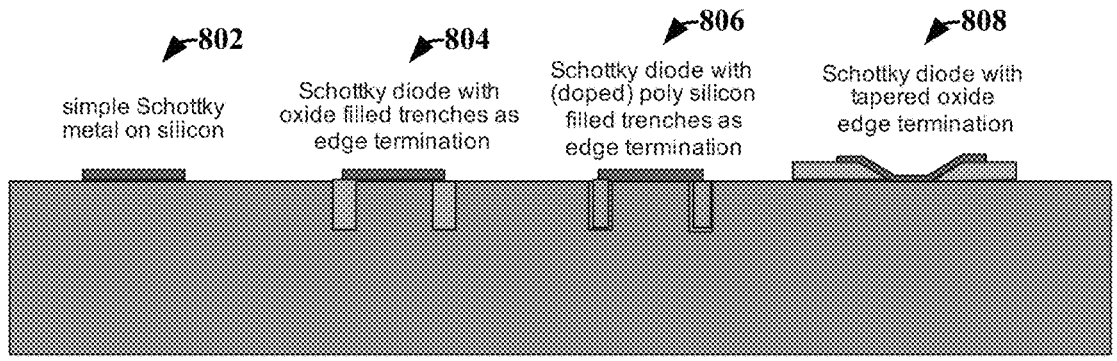
FIG. 8A shows several configurations of a bypass circuit that includes a Schottky diode, consistent with embodiments of the present disclosure.

FIG. 8A shows several configurations of a bypass circuit that includes a Schottky diode, consistent with embodiments of the present disclosure. 802 shows a metal on silicon approach. The Schottky diode at 804 includes oxide-filled trenches as edge termination. At 806, a Schottky diode includes polysilicon-filled trenches, which may be doped, as edge termination. At 808, a Schottky diode has tapered oxide edge termination.

Figure 8B:
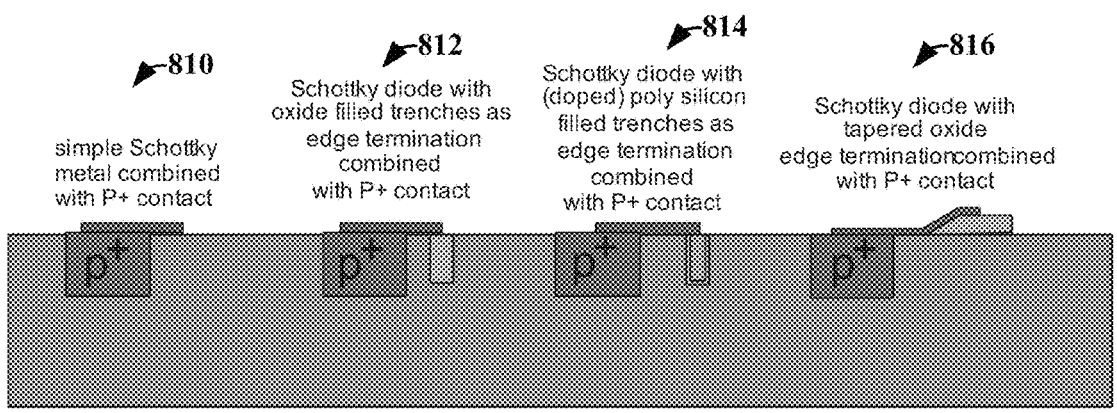
FIG. 8B shows several configurations of a bypass circuit that includes a Schottky diode with a P+ contact region, consistent with embodiments of the present disclosure.

FIG. 8B shows several configurations of a bypass circuit that includes a Schottky diode with a P+ contact region (e.g., utilizing an anode connection such as 220 in FIG. 2), consistent with embodiments of the present disclosure. At 810, a Schottky diode is combed with a p+ contact. At 812, a Schottky diode includes oxide-filled trenches as edge termination with a p+ contact. At 814, a Schottky diode includes polysilicon-filled trenches, which may be doped, as edge termination with a p+ contact. At 816, a Schottky diode has tapered oxide edge termination, also with a p+ contact.

Figure 8C:
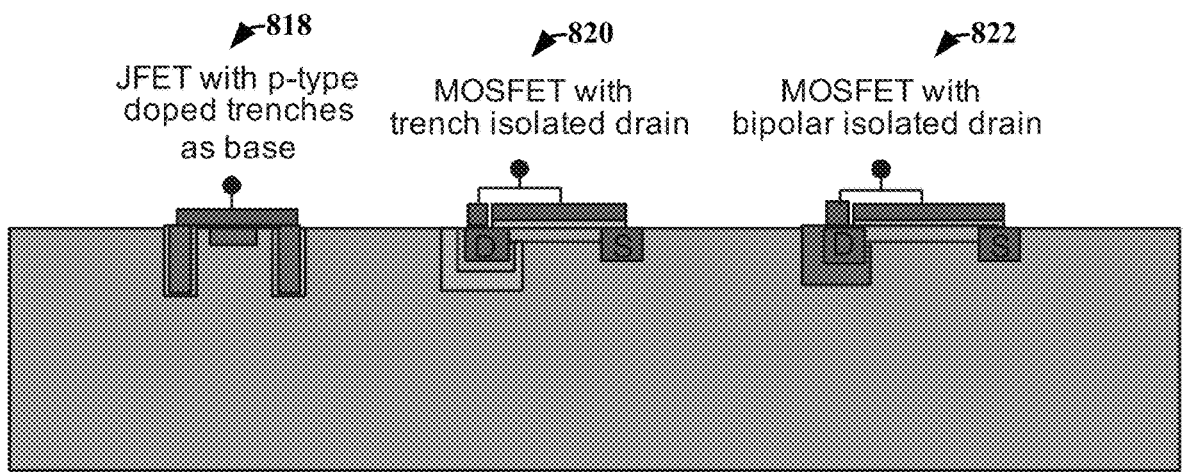
FIG. 8C shows several configurations of a bypass circuit that includes a FET, consistent with embodiments of the present disclosure.

FIG. 8C shows several configurations of a bypass circuit that includes a FET, consistent with embodiments of the present disclosure. At 818, a JFET is shown with p-type doped trenches as a base. Such a JFET may employ a highly doped p-type polysilicon in trenches. The trench walls are isolated by oxide (or another insulating material). The distance of the two trenches may be such that lowly doped n-type silicon is fully depleted at zero volt. A highly doped silicon region may serve as a contact region to the contact metal, which is also connected to the polysilicon. When the contact metal becomes forward biased with regards to the silicon, the depletion region becomes smaller and the channel opens. The lowly-doped region is therefore not connected at zero bias (or small positive bias) and contacted once current flows after triggering of the device.

At 820, a MOSFET is shown with a trench-isolated drain. A MOSFET with a bipolar isolated drain is shown at 822. Such a MOSFET may have a gate connected with a drain thereof. When the gate is biased, an inversion channel is created and connects the MOSFET source and drain. An isolation between the drain and epitaxial silicon region can be implemented to mitigate flow of electrons. Such isolation can be achieved by isolating the drain with oxide or with a p-type diffusion surrounding the drain.

Figure 9A:
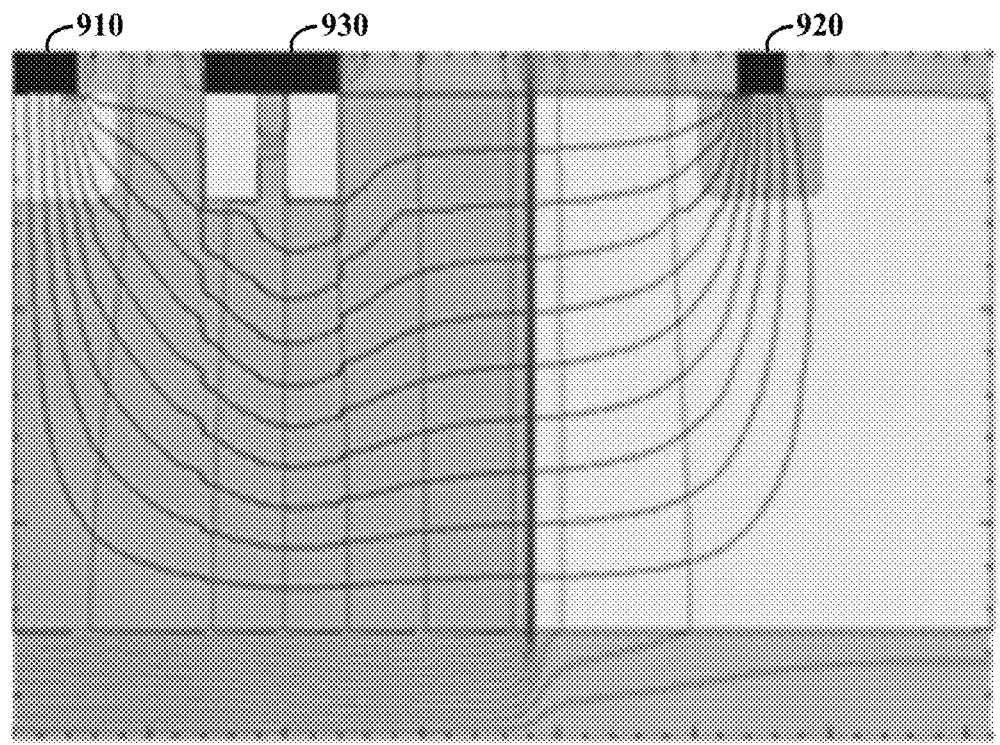
FIG. 9A is a diagram showing current flow when a Shockley diode is turned on, consistent with one or more embodiments of the present disclosure.
Figure 9B:
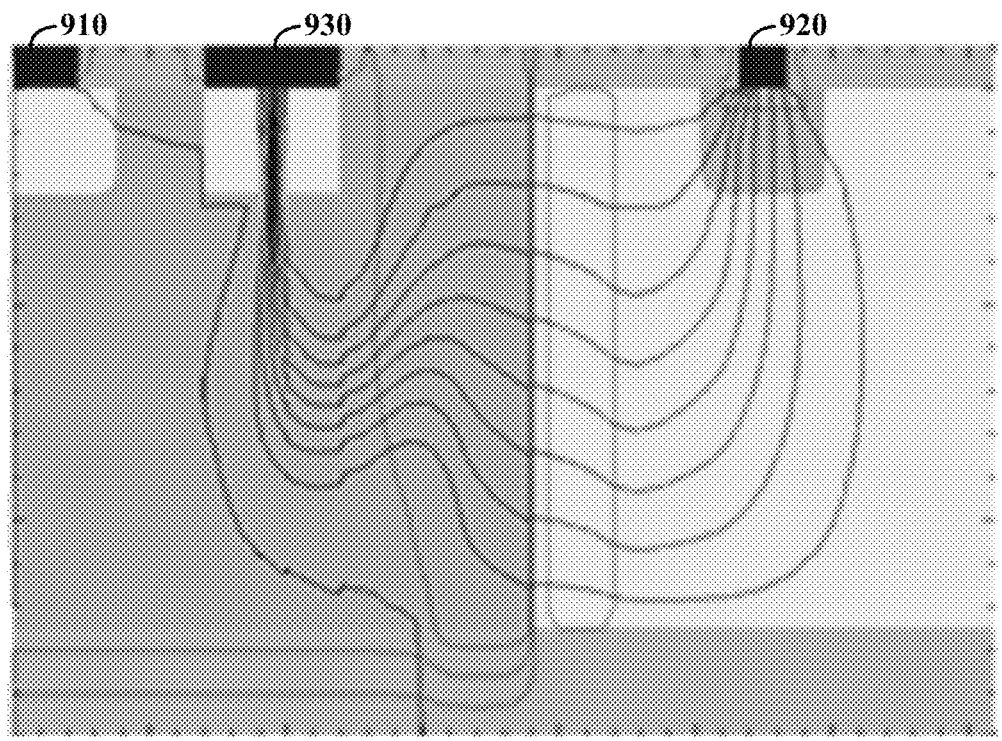
FIG. 9B shows current flow before the Shockley diode is turned on but after a bypass circuit begins to conduct, also consistent with one or more embodiments of the present disclosure.

FIG. 9A is a diagram showing current flow when a Shockley diode is turned on, consistent with one or more embodiments of the present disclosure. When the Shockley diode is turned on, the Shockley diode is conducting high current levels that flows between anode and cathode ends (910/920), mainly over an anode p-n junction. FIG. 9B shows current flow before the Shockley diode is turned on but after a bypass circuit at 930 begins to conduct, also consistent with one or more embodiments of the present disclosure.

Figure 10:
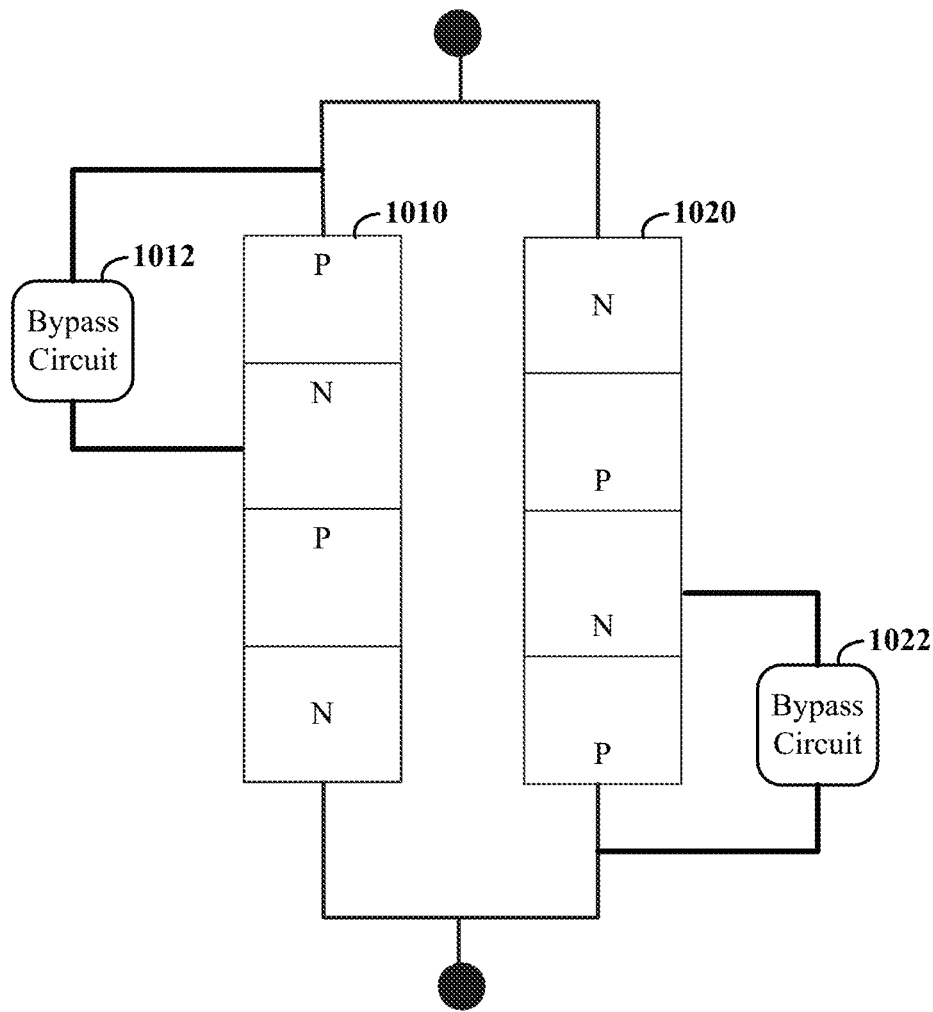
FIG. 10 is a bidirectional ESD protection apparatus, consistent with embodiments of the present disclosure.

FIG. 10 is a bidirectional ESD protection apparatus 1000, consistent with embodiments of the present disclosure. Two structures 1010 and 1020 of alternating p-type and n-type regions are connected in opposing directions, with bypass circuits 1012 and 1022 connected as shown. This provides a bidirectional device for shunting current. Upper and lower p-n junctions as shown may be implemented with lowly-doped material at the junctions, with higher-doped material at the middle p-n junctions. This approach, with the two (e.g., identical) structures in parallel, the capacitance of the apparatus 1000 may be implemented at a value that is the same as that of such structures with a single lowly doped p-n junction.

Figure 11:
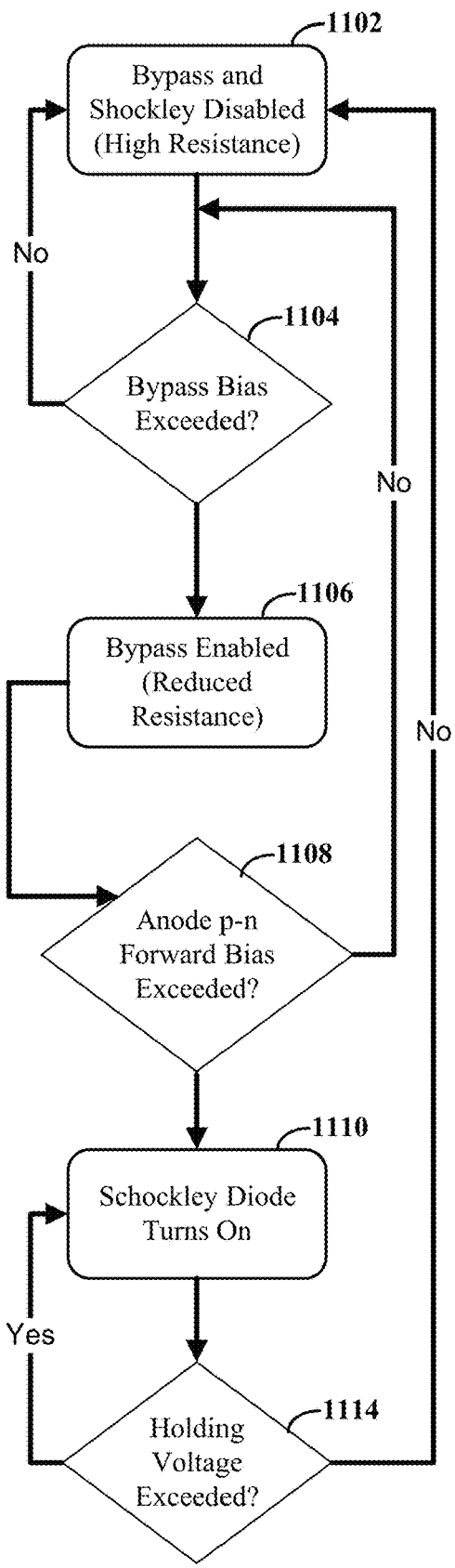
FIG. 11 is a flow diagram corresponding to the use of an ESD protection circuit, consistent with embodiments of the present disclosure.

FIG. 11 is a flow diagram corresponding to the use of an ESD protection circuit, consistent with embodiments of the present disclosure. When the voltage between the anode and cathode is low, both the bypass circuit and the Shockley diode are effectively disabled, per block 1102. In this condition, the current is low and is primarily due to leakage current. As the voltage across the Shockley diode increases toward the breakdown voltage, the current increases resulting in an increased voltage at the bypass circuit. This voltage continues to increase as the voltage across the Shockley diode increases. The bypass circuit remains at high impedance until the voltage exceeds the forward bias voltage of the bypass circuit, per block 1104. At this point, the bypass circuit is enabled and begins to conduct (shunt) carriers, per block 1106.

If the current continues to increase (due to a correspondingly increasing voltage across the diode), the voltage across the bypass circuit continues to increase. This voltage also corresponds to the voltage at the anode p-n junction. Thus, once the voltage exceeds the forward bias of the anode p-n junction, per block 1108, the anode p-n junction begins to conduct and inject holes. Assuming the trigger current is reached, the Shockley diode turns on, per block 1110. The Shockley diode then shunts (ESD) current until the holding voltage is no longer exceeded, per block 1114.

Figure 12:
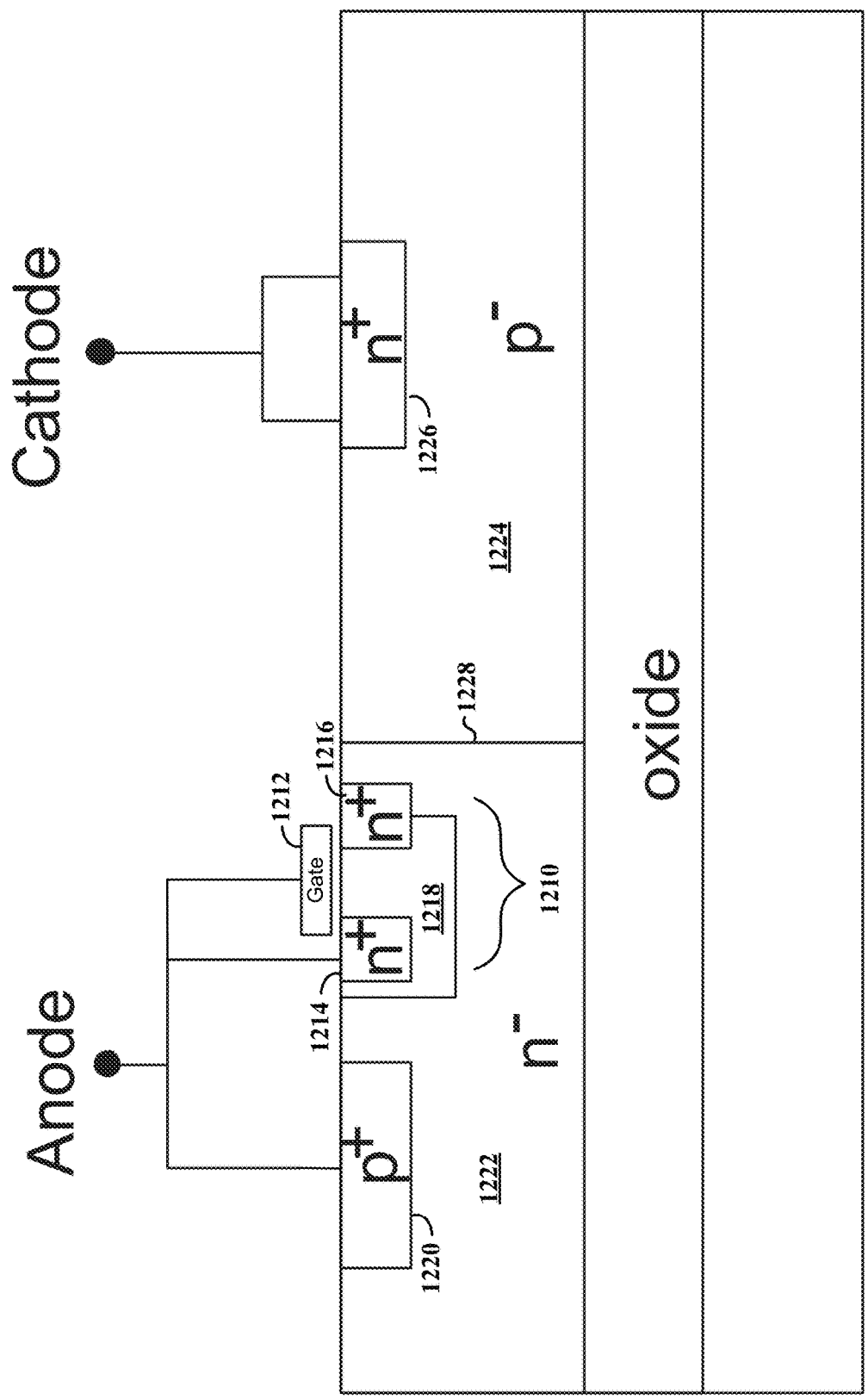
FIG. 12 shows an ESD protection circuit having a MOSFET bypass circuit, in accordance with another example embodiment.

FIG. 12 shows an ESD protection circuit having a MOS-FET bypass circuit, in accordance with another example embodiment. The bypass circuit includes a transistor 1210 having a gate 1212 and source/drain regions 1214 and 1216 as shown. A Shockley diode includes alternating semiconductor regions including p+ region 1220, n− region 1222, p-region 1224 and n+ region 1226. The gate 1212 and source/drain region 1214 are coupled to an anode along with the p+ region 1220, and a p-well region 1218 can be claimed to the n-region 1222. A junction at 1228 can be doped n+/p+ respectively in regions 1222 and 1224. An optional buried oxide layer is shown as well. Other similar circuits may be formed, with the transistor 1210 placed remotely from the Shockley diode (e.g., offset to the left or right of the anode or cathode) and connected accordingly, or otherwise integrated locally as shown.

Terms that indicate orientation, such as upper/lower, left/right, top/bottom and above/below, may be used herein to refer to relative positions of elements as shown in the figures. It should be understood that when the terminology is used for notational convenience, the disclosed structures may be oriented different from the orientation shown in the figures.

The specification describes and/or illustrates aspects useful for implementing the claimed invention(s) by way of various circuits or circuitry, which may be discussed using terms such as blocks, modules, device, system, unit, controller, comparator, and other circuit-type depictions. Such circuits or circuitry are discussed in connection with other elements to explain how certain embodiments may be carried out. For example, in certain of the above-discussed embodiments, one or more illustrated items in this context represent circuits (e.g., discrete analog or logic circuitry or (semi-)programmable circuits) configured and arranged for implementing disclosed operations/activities, as may be carried out in the approaches shown in the figures.

Based upon the above discussion and illustrations, those skilled in the art will readily recognize that various modifications and changes may be made to the various embodiments without strictly following the exemplary embodiments and applications illustrated and described herein. For example, methods as described in connection with the figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
a Shockley diode having a plurality of regions of semiconductor material including:
a first p region connected to an anode of the Shockley diode;
a first n region forming a first p-n junction with the first p region, the first p-n junction having a first forward-bias voltage;
a second p region forming a second p-n junction with the first n region,
wherein the second p-n junction is formed in series with the first p-n junction; and
a second n region connected to a cathode of the Shockley diode and forming a third p-n junction with the second p region, the third p-n junction formed in series with the second p-n junction; and
a bypass circuit connected to the anode and in parallel to the first p-n junction to form an electrical connection with the first n region, the bypass circuit having a second forward-bias voltage that is lower than the first forward-bias voltage of the first p-n junction,
wherein the bypass circuit is configured to bypass the first p region connected to the anode by shunting, to the anode, majority carriers generated by reverse biasing the second p-n junction.

2. The apparatus of claim 1, wherein the bypass circuit is configured and arranged to set a high trigger current of the Shockley diode by providing an increased amount of majority carrier current required to activate the Shockley diode via shunting of the majority carriers via the bypass circuit.

3. The apparatus of claim 2, wherein the Shockley diode is configured to activate in response to carriers in the first n region that are not shunted by the bypass circuit; and wherein the bypass circuit is configured to shunt carriers up to a current limit that corresponds to the increase in the amount of carrier current required to activate the Shockley diode.

4. The apparatus of claim 1, wherein the bypass circuit includes a Schottky diode.

5. The apparatus of claim 4, wherein the Schottky diode has a Schottky junction with edge termination on at least one edge of the Schottky junction.

6. The apparatus of claim 4, wherein the Schottky diode has a Schottky junction with a p+ contact on an edge of the Schottky junction.

7. The apparatus of claim 6, wherein the Schottky diode has edge termination on another edge of the Schottky junction.

8. The apparatus of claim 1, wherein the bypass circuit includes a field-effect transistor (FET).

9. The apparatus of claim 8, wherein the FET is a junction field-effect transistor (JFET).

10. The apparatus of claim 9, wherein the JFET includes a gate formed by one or more p-doped trenches.

11. The apparatus of claim 8, wherein the FET is a metal-oxide-semiconductor field-effect-transistor (MOS-FET).

12. The apparatus of claim 11, wherein the MOSFET includes a trench configured to isolate a drain of the MOS-FET from the first n region.

13. The apparatus of claim 11, wherein the MOSFET includes a third p-region that is configured to isolate a drain of the MOSFET from the first n region.

14. The apparatus of claim 1, wherein the first n region includes an n-region and an n+ region, the second p region includes a p− region and a p+ region, and wherein the second p-n junction is at an intersection of the n+ region and the p+ region.

15. The apparatus of claim 14, wherein the n+ doped region includes an n++ doped region and the p+ region includes a p++ doped region that forms a portion of the intersection.

16. An apparatus comprising:
a first circuit comprising a plurality of alternating p-type and n-type semiconductor regions with respective p-n junctions therebetween, the first circuit being configured and arranged to shunt current between an anode end of the first circuit and a cathode end of the first circuit; and
a second circuit connected to one of the alternating p-type and n-type semiconductor regions and forming a further p-n junction therewith, the further p-n junction having a forward-bias voltage that is lower than a first forward-bias voltage of another p-n junction formed by the one of the alternating p-type and n-type semiconductor regions with another one of the alternating p-type and n-type semiconductor regions, wherein the second circuit is a bypass circuit configured to bypass a p region of an anode p-n junction of the first circuit shunting, to the anode end, majority carriers generated by reverse biasing of at least one of the respective p-n junctions.

17. The apparatus of claim 16, wherein the first circuit includes a Shockley diode, and the bypass circuit is configured and arranged to provide an increased trigger current required to activate the Shockley diode by flowing carriers with the one of the alternating p-type and n-type semiconductor regions that forms the further p-n junction.

18. A method comprising:
disabling, in an OFF-mode of a Shockley diode, a bypass circuit that, when enabled, bypasses a capacitance of an anode p-n junction;
enabling, in response to a voltage created by carrier current in the Shockley diode, a bypass circuit to bypass the anode p-n junction and capacitance by shunting majority carrier current within the Shockley diode to an anode; and
enabling, in ON-mode of the Shockley diode, the Shockley diode to conduct majority carriers between a cathode and the anode.

19. The method of claim 18, wherein the shunting majority carrier current includes passing current through a bypass circuit that has a lower forward bias than a forward bias of the anode p-n junction of the Shockley diode.

* * * * *